United States Patent
Stirk et al.

(10) Patent No.: US 8,436,620 B2
(45) Date of Patent: May 7, 2013

(54) VOLTAGE MONITORING USING BITSTREAM SIGNAL PROCESSING

(75) Inventors: Gary Lee Stirk, West Melbourne, FL (US); Brian Allen, Grant, FL (US); Umar Jameer Lyles, Palm Bay, FL (US); John Houldsworth, Reston, VA (US); Brian Lum-Shue-Chan, Palm Bay, FL (US); Bertan Bakkaloglu, Scottsdale, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 439 days.

(21) Appl. No.: 12/874,911

(22) Filed: Sep. 2, 2010

(65) Prior Publication Data

US 2012/0056624 A1  Mar. 8, 2012

(51) Int. Cl.
  *G01N 27/416* (2006.01)
(52) U.S. Cl.
  USPC .......................... 324/433; 324/434; 324/426
(58) Field of Classification Search .................. None
  See application file for complete search history.

(56) References Cited

U.S. PATENT DOCUMENTS

| | | |
|---|---|---|
| 6,360,283 B1 | 3/2002 | Houldsworth |
| 6,646,420 B1 | 11/2003 | Goldman |
| 7,113,122 B2 | 9/2006 | Gangstoe et al. |
| 7,250,886 B1 | 7/2007 | Killat et al. |
| 7,372,384 B1 | 5/2008 | Xu |
| 7,514,999 B2 | 4/2009 | Killat |
| 7,623,053 B2 | 11/2009 | Terry et al. |
| 2011/0274952 A1* | 11/2011 | Itagaki et al. ............. 429/93 |

FOREIGN PATENT DOCUMENTS

WO  WO 2006/100270 A1  9/2006

* cited by examiner

*Primary Examiner* — Minh N Tang
(74) *Attorney, Agent, or Firm* — William B. Kempler; Wade J. Brady, III; Frederick J. Telecky, Jr.

(57) ABSTRACT

Systems and methods are provided for monitoring a voltage. A level shifter is configured to generate a current proportional to the voltage of the battery cell. A delta-sigma modulator is configured to convert the current into a first density modulated bitstream representing the voltage of the battery cell. A first reference source is configured to provide a second density modulated bitstream representing a first threshold voltage. A first comparator is configured to compare the first density modulated bitstream and the second density modulated bitstream.

20 Claims, 5 Drawing Sheets

VOLTAGE MONITORING USING BITSTREAM SIGNAL PROCESSING

TECHNICAL FIELD

The present invention relates to electronic systems and, more particularly, to systems and methods for voltage monitoring using bitstream signal processing.

BACKGROUND OF THE INVENTION

A battery is typically comprised of a number of individual cells that are connected in series to produce an overall battery voltage. Some battery types, such as nickel-cadmium or nickel-hydrogen, are rechargeable. When maintaining such a battery, several problems may occur that irreversibly damage the battery or reduce its performance or lifespan. To avoid these problems, it is advantageous to monitor the voltage across each battery cell when the battery is being recharged or discharged.

SUMMARY OF THE INVENTION

In accordance with one aspect of the present invention, an apparatus is provided for monitoring a voltage. A level shifter is configured to generate a current proportional to the voltage of the battery cell. A delta-sigma modulator is configured to convert the current into a first density modulated bitstream representing the voltage of the battery cell. A first reference source is configured to provide a second density modulated bitstream representing a first threshold voltage. A first comparator is configured to compare the first density modulated bitstream and the second density modulated bitstream.

In accordance with another aspect of the present invention, a method is provided for monitoring a voltage. A current is produced, representing the voltage. The current is provided to a delta-sigma modulator configured to provide a first density modulated bitstream representing the voltage. A second density modulated bitstream is generated, representing a first threshold voltage. The first density modulated bitstream is compared to the second density modulated bitstream.

In accordance with yet another aspect of the present invention, a system is provided for monitoring voltage within a battery comprising a stack of battery cells. A first reference source is configured to provide a first density modulated bitstream representing a first threshold voltage. A plurality of cell monitoring assemblies are each configured to monitor a voltage of an associated cell of the stack of battery cells. Each cell monitoring assembly comprises a level shifter configured to generate a current proportional to the voltage of the associated battery cell and a delta-sigma modulator configured to convert the current into a second density modulated bitstream representing the voltage of the associated battery cell. Each cell monitoring assembly further comprises a first comparator configured to compare the first density modulated bitstream and the second density modulated bitstream.

DETAILED DESCRIPTION OF INVENTION

Figure 1:
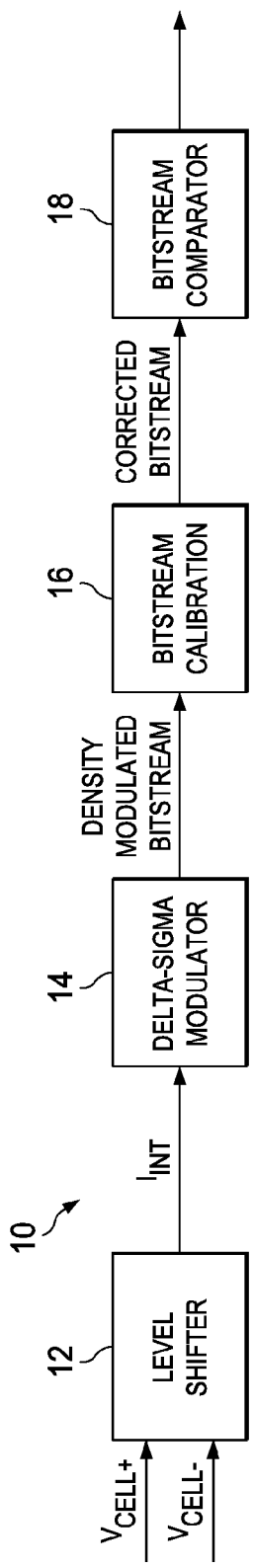
FIG. 1 illustrates an assembly for monitoring a voltage of interest in accordance with an aspect of the present invention.

FIG. 1 illustrates an assembly 10 for monitoring a voltage of interest, $V_{INT}$, in accordance with an aspect of the present invention. The assembly 10 is configured to shift a non-ground referenced voltage into a ground referenced, density modulated bitstream and process the shifted signal in a bitstream domain. It will be appreciated that, for the purposes of this application a "density modulated bitstream" is a digital signal representing a value of interest as the proportion of bits within a selected portion of a signal having a given value (e.g., 0 or 1). Since this form of pulse density modulation is more common in analog signals, it can be conceptualized as a hybrid of digital and analog signal processing, referred to herein as Virtual Analog (V/A) processing. In V/A processing, each signal is represented as noise-shaped, density modulated bitstreams. Similarly, references to processing a signal in a "bitstream domain" refer to an operation performed on one or more density modulated bitstreams. It will be appreciated that an operation performed in the bitstream domain can temporarily increase the word size of one or more bitstream signals that are the object of the operation (e.g., to express intermediate values as fractional bits), but that each input and the output of the operation will be in a density modulated bitstream format.

The assembly 10 includes a level shifter 12 configured to generate a current, $I_{INT}$, proportional to the voltage. In one implementation, the level shifter 12 incorporates an amplifier biased to a midpoint of the measured voltage with a current resistively balanced back to the amplifier. This current can then be provided, for example, via a current mirror, to a delta-sigma modulator 14 configured to convert the current into a density modulated bitstream representing the voltage. Alternatively, the voltage can be converted directly to current, for example, using a resistor of known resistance. In one implementation, the delta-sigma modulator 14 includes a capacitor that acts to integrate the incoming current as well as a feedback mechanism to reduce the charge of the capacitor when a voltage high is produced. By converting a density modulated bitstream in this manner, it will be appreciated that no high voltage control or switching is necessary. Further, the capacitor approach obviates the need for component matching and the continuous charging and drain of the capacitor allows for a more precise capture of signal information. Finally, by using the capacitor for the integration function, the addition of active elements can be avoided, reducing the chip space necessary to implement the assembly 10 and improving performance.

The density modulated bitstream provided by the delta-sigma modulator 14 is provided to a bitstream calibration component 16. The bitstream calibration component 16 comprises at least one signal processing element configured to manipulate the bitstream density in the bitstream domain to alter the value represented by the density modulated bitstream. For example, the calibration component can include a scaling component configured to attenuate the bitstream density by a desired factor. Similarly, an offset component can provide an offset to the bitstream density. The calibrated bitstream is then provided to a bitstream comparator 18. The bitstream comparator 18 is configured to compare the density modulated bitstream, representing the voltage of interest, with a second density modulated bitstream representing a reference voltage. For example, the bitstream comparator 18 can include an adder and an accumulator that stores the output of the adder until the content of the accumulator achieves a threshold value. The output of the bitstream comparator 18 can be output as an indication of the value of the voltage of interest relative to the threshold voltage. It will be appreciated that each of the bitstream calibration component 16 and the bitstream comparator 18 can be implemented using digital logic gates, allowing for a low power and minimal chip space implementation of these components.

Figure 2:
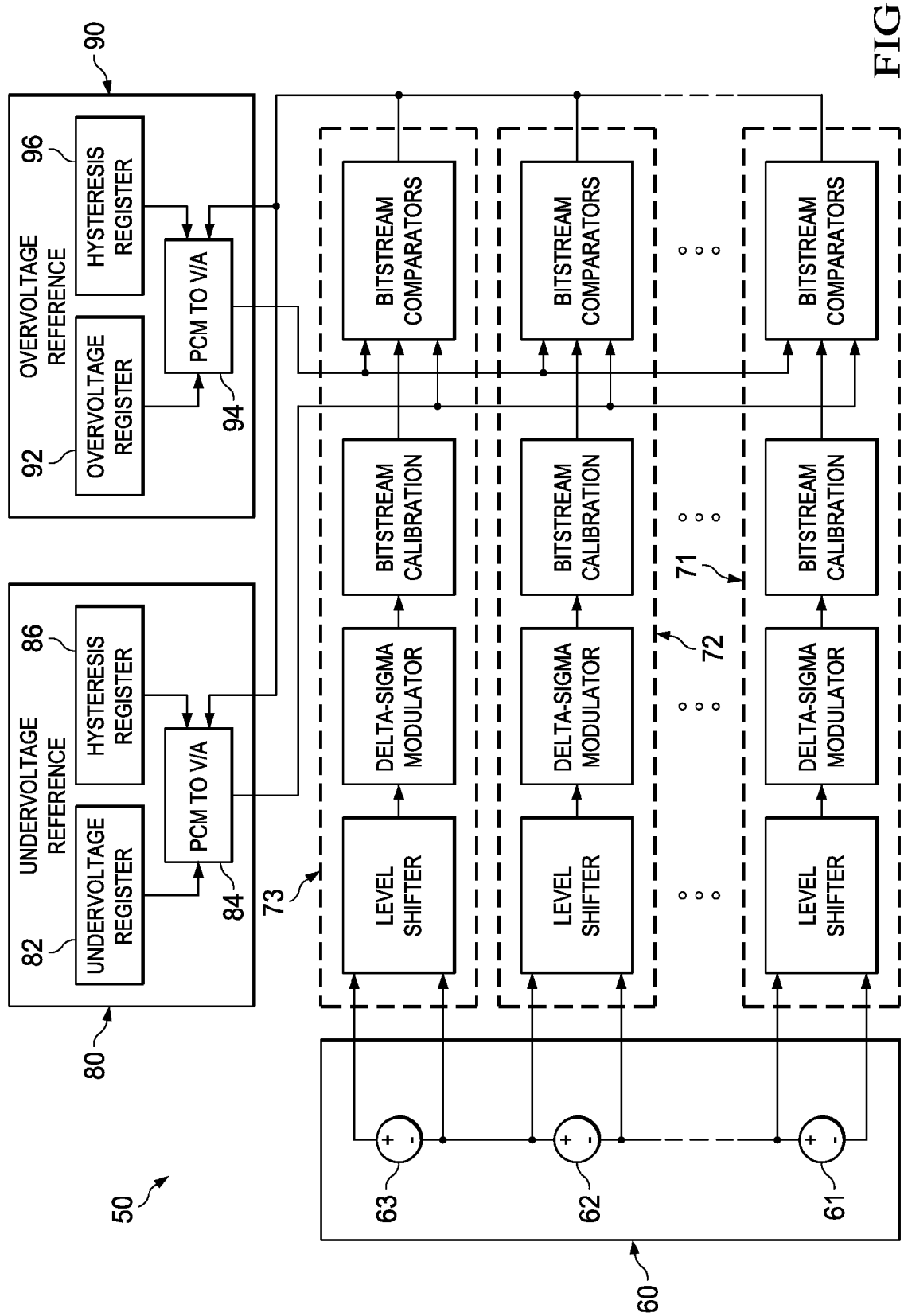
FIG. 2 illustrates an exemplary system for monitoring the voltage of a battery comprising a plurality of battery cells in accordance with an aspect of the present invention.

FIG. 2 illustrates an exemplary system 50 for monitoring the voltage of a battery 60 comprising a plurality of battery cells 61-63 in accordance with an aspect of the present invention. The system 50 includes a plurality of monitoring assemblies 71-73 similar to that described in FIG. 1, each monitoring the voltage across one of the plurality of battery cells. It will be appreciated that, after a first cell 61 of the plurality of cells 61-63, the voltage of each cell 62 and 63 would not be ground referenced. In accordance with an aspect of the present invention, each of the plurality of monitoring assemblies 71-73 can utilize at least first and second bitstream comparators, with a first bitstream comparator comparing the monitored voltage to a first threshold voltage, representing an undervoltage condition of the battery cell, and a second bitstream comparator comparing the monitored voltage to a second threshold voltage, representing an overvoltage condition of the battery cell. Accordingly, the system 50 is configured to ensure that each of the plurality of battery cells 61-63 remain within a desired range and report deviations from that range to an affiliated system (not shown).

An undervoltage reference source 80 provides a first reference bitstream to each of the monitoring assemblies 71-73. The undervoltage reference source 80 can include an undervoltage register 82 that stores an undervoltage value representing a lower bound of the desired voltage range for the cells 61-63 as a pulse code modulated (PCM) value and a first pulse code to density modulation converter 84 for converting the value stored in the undervoltage register into the first reference bitstream. In the illustrated implementation, the undervoltage reference source 80 further includes a first hysteresis register 86, containing a hysteresis value, represented as a PCM value, having a value greater than the value stored in the undervoltage register 82. It will be appreciated that the pulse code to density modulation converter 84 can be associated with appropriate switching means for accessing the first hysteresis register 86 in response to an indication from one of the monitoring assemblies 71-73 that an undervoltage has been detected. For example, the pulse code to density modulation converter 84 can utilize a delta-sigma modulator to provide a noise-shaped bitstream signal. The switching means can be configured to continue accessing the hysteresis register 86 until the detected voltage falls below the hysteresis reference, at which point normal operation can be resumed. The use of a hysteresis reference allows the system to avoid fluctuation between an alert and a non-alert condition when the voltage of a given cell is around the lower bound represented by the undervoltage register 82.

An overvoltage reference source 90 provides a second reference bitstream to each of the monitoring assemblies 71-73. The overvoltage reference source 90 can include an overvoltage register 92 that stores an overvoltage value, represented as a PCM value, representing an upper bound of the desired voltage range for the cells 61-63 and a second pulse code to density modulation converter 94 for converting the value stored in the overvoltage register into the second reference bitstream. The overvoltage reference source 90 includes a second hysteresis register 96, storing a hysteresis value less than the upper bound of the voltage range as a PCM value. Appropriate switching means can be provided, such that, upon detection of an overvoltage condition by any of the monitoring assemblies, the value stored in the hysteresis register 96 is used to provide the second density modulated bitstream until the voltage falls back below the hysteresis voltage.

Figure 3:
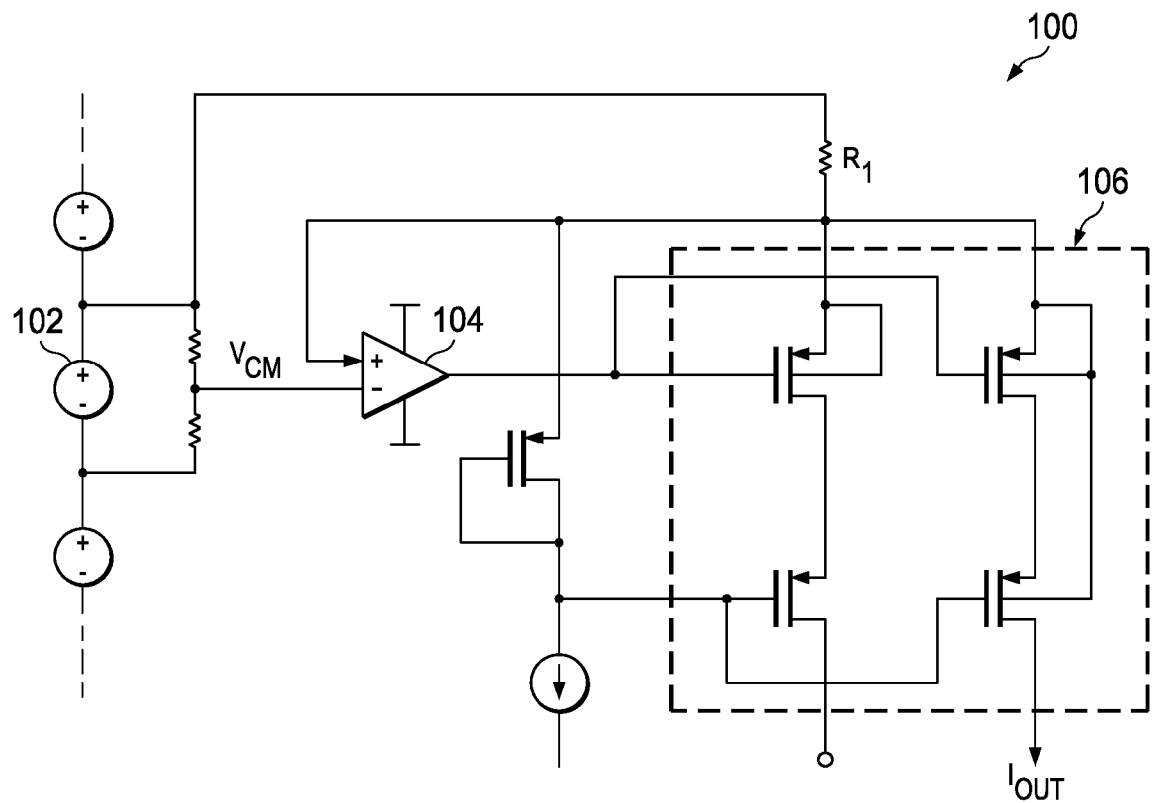
FIG. 3 illustrates an exemplary level shifter for providing a feedback current representing a cell voltage in accordance with an aspect of the present invention.

FIG. 3 illustrates an exemplary level shifter 100 for providing a feedback current representing a cell voltage in accordance with an aspect of the present invention. A common mode voltage of the cell 102 is provided to an operational amplifier 104 to bias the summing junction amplifier to the common mode voltage. The operational amplifier 104 is configured to balance a current resistively, through a resistor $R_1$, back to the summing node in a negative feedback arrangement, such that the feedback current is proportional to a voltage across the battery cell. In the illustrated implementation, the provided current is equal to the voltage across the cell divided by twice the resistance of the resistor, $R_1$. The current mirror 106 is configured to provide a scaled mirroring of the current as an output to the level shifter 100. In the illustrated implementation, the current mirror 106 provides a current scaled to one-tenth of the original value, such that the current output, $I_{OUT}$, from the level shifter 100 is equal to the voltage across the battery cell divided by twenty times the resistance.

Figure 4:
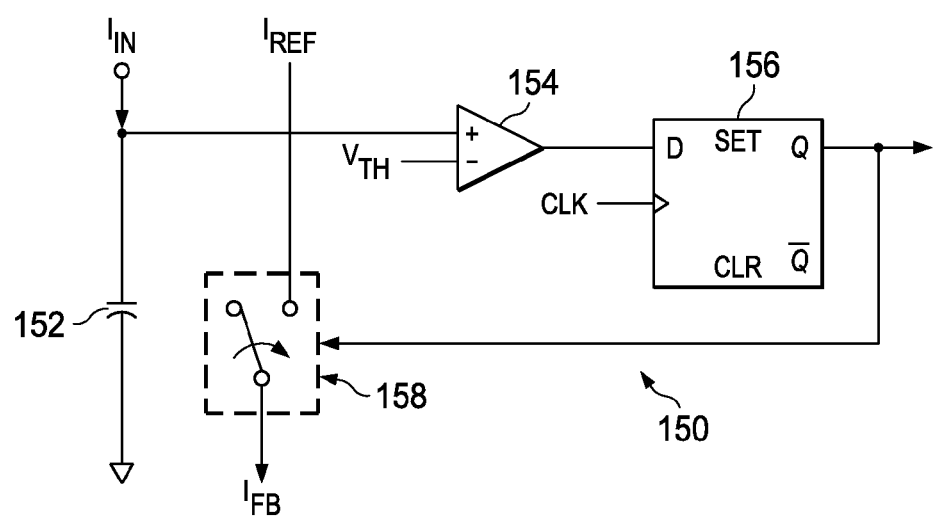
FIG. 4 illustrates an exemplary delta-sigma modulator in accordance with an aspect of the present invention.

FIG. 4 illustrates an exemplary delta-sigma modulator 150 in accordance with an aspect of the present invention. The delta-signal modulator provides a noise shaped bit stream suppressing noise in a frequency band of interest. It will be appreciated that while FIG. 4 illustrates a first order DS modulation, that a higher order DS modulation can be used. In accordance with an aspect of the present invention, the integration function of the delta-sigma modulator is provided via a charging of a capacitor 152, eliminating the need for active gain elements in the design. Accordingly, the necessary area utilized by the delta-sigma modulator 150 on the chip can be reduced while improving the overall performance of the modulator. The output of the delta-sigma modulator 150 is a density modulated bitstream representing the magnitude of an input current.

To this end, the input current representing the cell voltage, $I_{in}$, is provided to charge the capacitor 152, and the voltage of the capacitor is provided as a first input to a comparator 154. A threshold voltage, $V_{th}$, is provided as a second input of the comparator 154. The threshold voltage, $V_{th}$, can be arbitrarily selected from a range of reasonable values. It will be appreciated that, in a system monitoring multiple battery cells and incorporating multiple instantiations of the illustrated delta-sigma modulator 150, that the reference voltage can be the same for each modulator. The output of the comparator 154 is provided to a flip-flop 156 driven by a clock signal to provide a first order modulated bit stream representing the cell voltage. The output of the flip-flop 156 is fed back to a switch 158 configured to selectively isolate the capacitor 152 from a fixed feedback current, $I_{fb}$, that opposes the input current as to provide the necessary feedback to the capacitor 152 when a voltage high is produced at the comparator, such that the capacitor provides the integrator function of the delta-sigma modulator 150.

Figure 5:
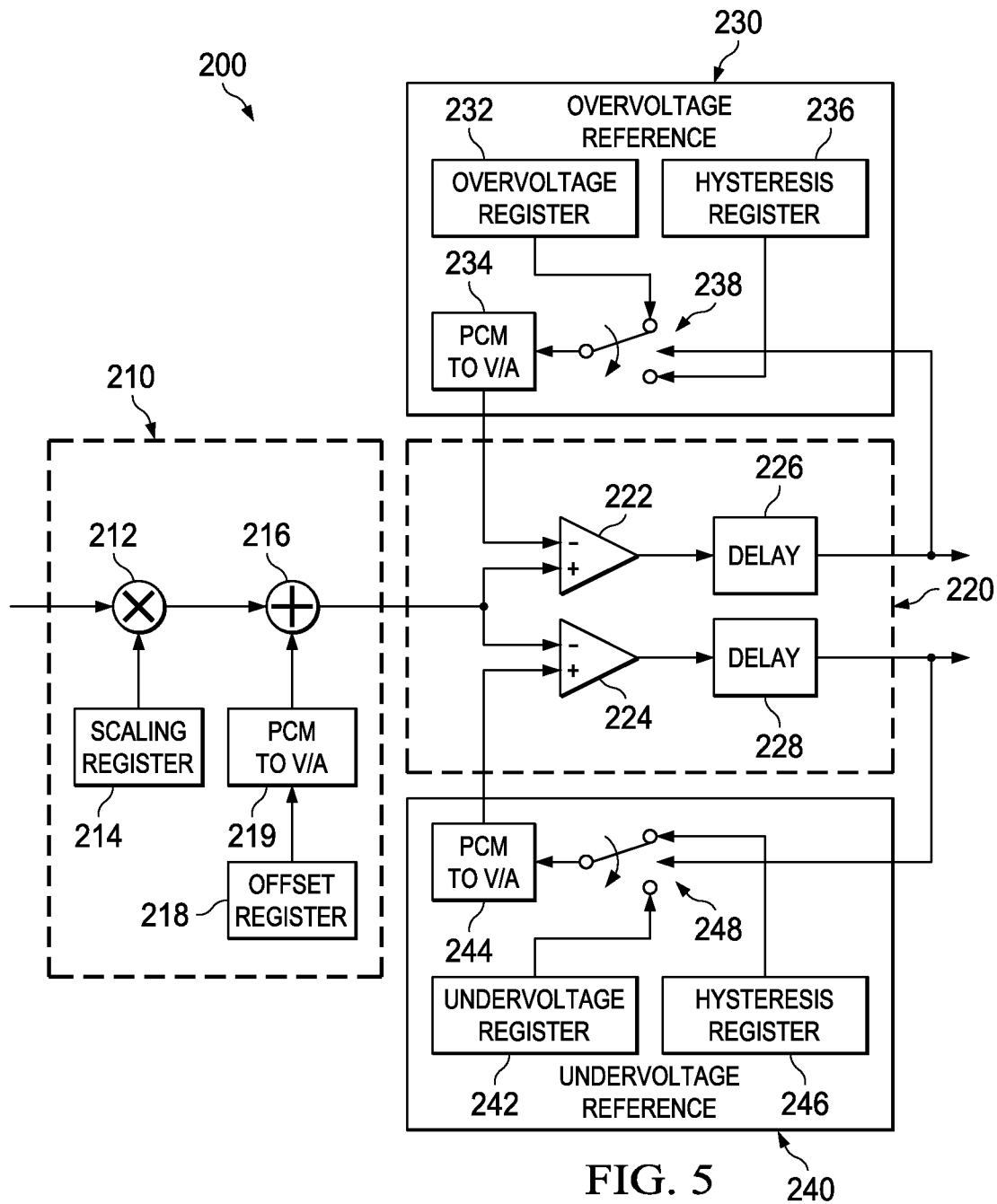
FIG. 5 illustrates an exemplary implementation of a density modulated processing component in accordance with an aspect of the present invention.

FIG. 5 illustrates an exemplary implementation of a density modulated processing component 200 in accordance with an aspect of the present invention. The density modulated processing component 200 comprises a calibration portion 210 that provides a density modulated scaling and offset to a density modulated bitstream. The calibration portion 210 comprises a scaling component 212 configured to attenuate the density modulated bitstream by a desired factor, stored in a scaling register 214. In one implementation, the scaling component 212 can comprise combining a first single-bit bitstream, weighted by the desired scaling factor and representing the density modulated bitstream, and a second single-bit bitstream, weighted by one minus the desired scaling factor and representing a zero value for the signal, to form a multi-bit combined bitstream. The combined bitstream is then remodulated into a single bit bitstream.

Figure 6:
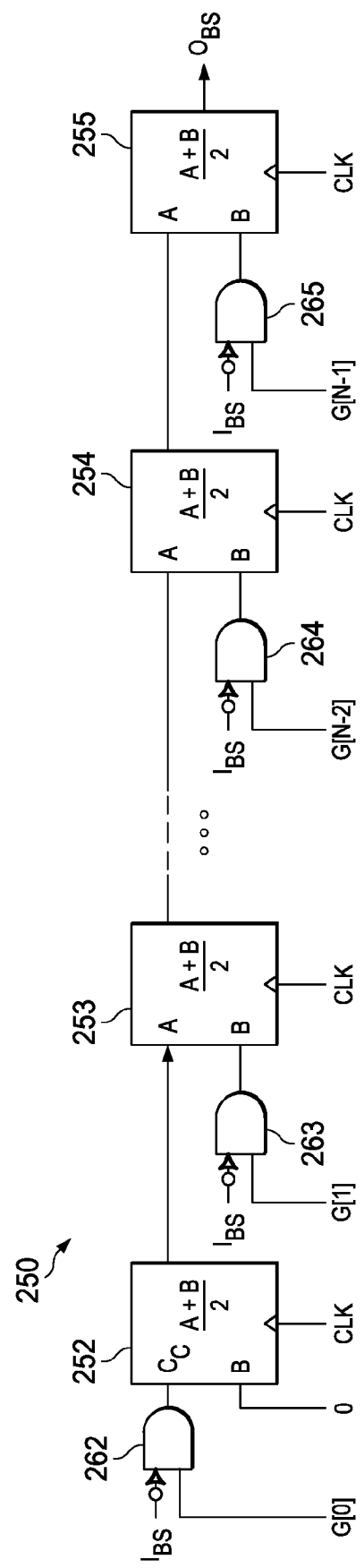
FIG. 6 illustrates an exemplary implementation of a density modulated scaling component in accordance with an aspect of the present invention.

FIG. 6 illustrates an exemplary implementation of a density modulated scaling component 250 in accordance with an aspect of the present invention. The density modulated scaling component receives an input density modulated bitstream ($I_{BS}$) and a scaling value between zero and one, represented as a multibit digital value (G[0:N-1]). For example, the scaling value can be represented as an eight-bit value capable of representing values with a resolution of $1/256$.

The processing component comprises a series of clocked full adders 252-255 configured to apply an attenuation to an input density modulated bitstream signal. Each full adder 252-255 has a corresponding logical AND gate 262-265 that provides a first input to its corresponding full adder. Each AND gate 262-265 receives the density modulated bitstream signal as one input and one bit of the scaling value as a second input. Specifically, a first AND gate 262 receives a least significant bit, G[1], of the scaling value and a final AND gate 265 receives a most significant bit, G[N], of the scaling value. The resulting output from each AND gate 262-265 is either the original density modulated bitstream signal, if the bit from the scaling component was a one, or a voltage low if the bit from the scaling component is a zero.

A first full adder 252 in the series of full adders receives a zero density signal (e.g., a constant voltage low) as a second input. The first full adder 252 outputs a density modulated bitstream signal representing an average of the value represented by the original density modulated bitstream signal and the output of the first AND gate 262. Since the AND gate will produce either a zero density signal, or the original density modulated signal, the output of the first full adder 252 will be a signal representing either a zero density signal or a signal having a density one-half that of the original signal, depending on the least significant bit of the scaling value. This output is provided to the second full adder 253 as a second input, and the averaging process continues until a final value is produced at a final full adder 255 in the series of adders. It will be appreciated that, since the contribution from each full adder 252-254 other than the final full adder 255 is divided by two at each successive adder, the contribution from each adder is proportional to the bit from the scaling value provided by its associated adder. Accordingly, for an N-bit scaling value G[0, N-1], the output $O_{BS}$ of the density modulated scaling component 250 is equal to:

$$O_{BS} = \sum_{i=0}^{N-1} \frac{I_{BS} G[i]}{2^{N-i}} = I_{BS} \sum_{i=0}^{N-1} \frac{G[i]}{2^{N-i}} = I_{BS} G[0, N-1];$$

where $I_{BS}$ is the value represented by the input density modulated bitstream signal, and G[i] is an $i^{th}$ bit of the multibit scaling value, where i=0 represents the least significant bit, and i=N-1 represents the most significant bit.

An offset component 216 is configured to provide an offset, represented by a value stored in an offset register 218 and converted to a density modulated bitstream by a pulse code to density modulation converter 219, to the density modulated bitstream in the bitstream domain. In one implementation, the offset component 216 can be configured to combine two weighted bitstreams into a multi-bit bitstream and remodulate the combined bitstream into a single bit bitstream. In accordance with an aspect of the present invention, the offset component 216 can be part of the density modulated scaling component 250 illustrated in FIG. 6, such that the scaling component can also apply the offset from the offset register 218. For example, each bit of the value provided in the offset register 218 can be provided to a carrying of each adder.

The corrected density modulated bitstream is then provided as a first input to a bitstream comparator 220. The bitstream comparator 220 comprises first and second bitstream comparators 222 and 224 that compare the voltage represented by the density modulated bitstream to respective first and second reference bitstreams and respective delay components 226 and 228. A first bitstream comparator 222 determines if the voltage represented by the density modulated bitstream is larger than a first threshold voltage representing a maximum desired voltage. To this end, an overvoltage reference source 230 can provide the first reference bitstream as one input (e.g., the inverting input) to the first bitstream comparator 222, with the density modulated bitstream representing the common mode voltage provided as the other input. The overvoltage reference source 230 can include a first register 232 containing an overvoltage level for comparison and a first pulse code to density modulation converter 234 for converting the value stored in the register into the first reference bitstream. In some implementations, a degree of hysteresis may be desired. To this end, in the illustrated implementation, the first overvoltage reference source 230 further includes a second register 236, containing a hysteresis voltage having a value less than the maximum threshold voltage stored in the first register, and appropriate switching means 238 for providing the hysteresis voltage to the first pulse code to density modulation converter 234 once an overvoltage has been detected, and providing the threshold voltage from the first register 232 once the voltage has fallen below the hysteresis voltage. In one implementation, the switching means 238 can include a field effect transistor (FET).

Similarly, a second bitstream comparator 224 determines if the voltage represented by the density modulated bitstream is smaller than a threshold voltage representing a minimum desired voltage. To this end, an undervoltage reference source 240 can provide the second reference bitstream as one input (e.g., the inverting input) to the second bitstream comparator 224, with the density modulated bitstream representing the common mode voltage provided as the other input. The undervoltage reference source 240 can include a third register 242 containing an undervoltage level for comparison and a second pulse code to density modulation converter 244 for converting the value stored in the third register into the second reference bitstream. In the illustrated implementation, the undervoltage reference source 240 also includes a fourth register 246, containing a hysteresis voltage having a value greater than the minimum threshold voltage stored in the third register, and appropriate switching means 248 for providing the hysteresis voltage to the second pulse code to density modulation converter 244 once an undervoltage has been detected.

In the one implementation, each bitstream comparator 222 and 224 comprises a scaling component for each input that reduces the bit density by a predetermined value (e.g., one-quarter). It will be appreciated that the scaled signal can be a multibit signal incorporating fractional bits. The two scaled signals are then provided to an adder where the inverting input is subtracted from the noninverting input. The output of the adder is provided to an accumulator that acts as an up/down counter, with the range of the accumulator being selected such that a maximal value within the accumulator indicates that the non-inverting output exceeds the inverting output. It will be appreciated that the multibit output of the accumulator can be read directly or remodulated into a bit density modulated output.

Each delay component 226 and 228 is configured to monitor the outputs an associated one of the first and second bitstream comparators 222 and 224. When an overvoltage or undervoltage is detected at one of the comparators 222 and 224, the associated delay component 226 and 228 ensures that the detected overvoltage or undervoltage persists for a desired period before an alert is provided to an operator. Accordingly, transient voltage changes unlikely to harm the device or battery can be ignored.

Figure 7:
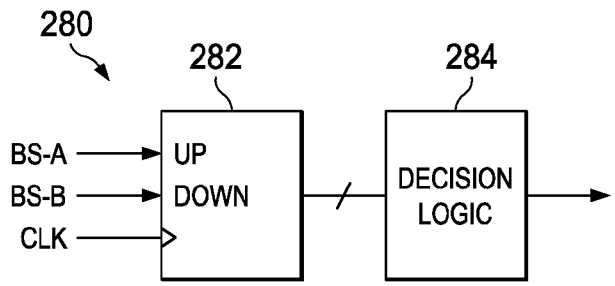
FIG. 7 illustrates one implementation of a bitstream comparator in accordance with an aspect of the present invention.

FIG. 7 illustrates one implementation of a bitstream comparator 280 in accordance with an aspect of the present invention. An N-bit up-down counter 282 receives two density modulated bitstreams as two inputs as well as a clock signal at an appropriate clock input. A first bitstream can be provided to the positive input and the second input can be provided to the negative input, such that, when the counter is clocked, the counter is incremented upward when the first input is a voltage high and the second input is a voltage low and incremented downward when the first input is a voltage low and the second input is a voltage high. The output of the counter is provided to a decision logic component 284. The decision logic component 284 is configured to report that the density of the first bitstream exceeds the density of the second bitstream when the counter reaches a threshold positive value (e.g., a maximum value of the counter), and to report that the density of the first bitstream is less than the density of the second bitstream when the counter reaches a threshold negative value (e.g., a minimum value of the counter). Accordingly, the density of the bitstreams can be quickly and accurately compared using digital logic components, allowing for an implementation that conserves both power and chip space.

Figure 8:
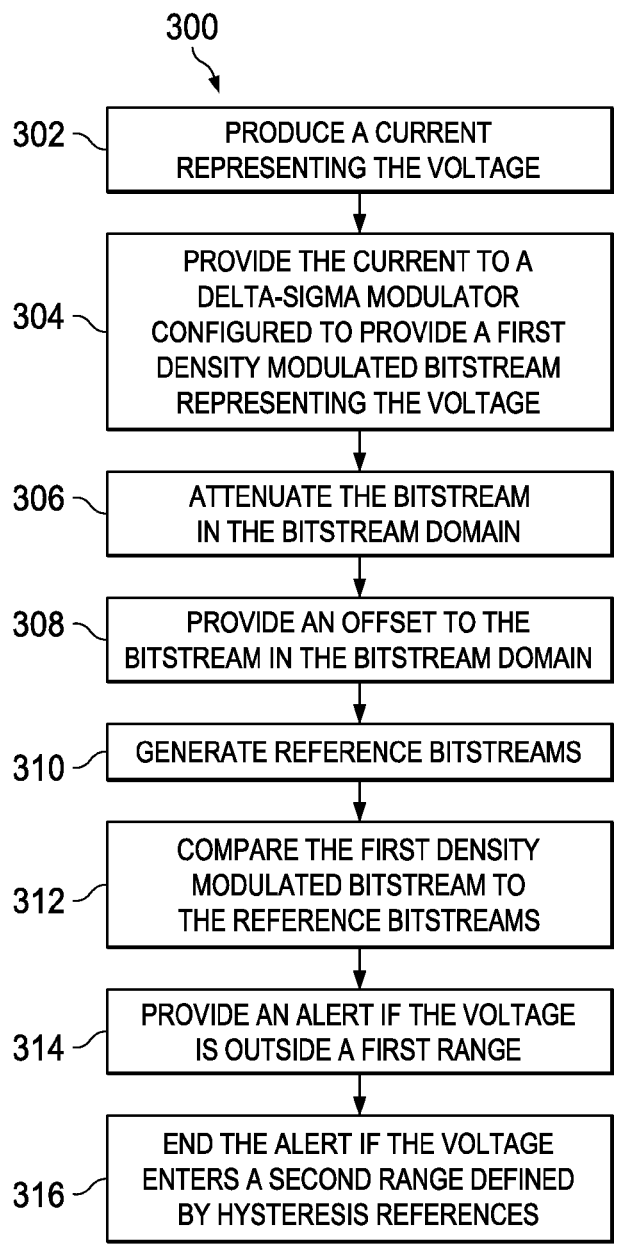
FIG. 8 illustrates a methodology for monitoring a voltage in accordance with an aspect of the present invention.

In view of the foregoing structural and functional features described above, a methodology in accordance with various aspects of the present invention will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 8 illustrates a methodology 300 for monitoring a voltage in accordance with an aspect of the present invention. At 302, a current, representing the voltage, is produced. For example, the current can be produced by biasing an amplifier to a midpoint of the voltage and resistively balancing the current back to the amplifier. At 304, the current is provided to a delta-sigma modulator configured to provide a first density modulated bitstream representing the voltage. In an exemplary implementation, the current can be provided to a ground referenced capacitor that provided the integration function of the delta-sigma modulator.

At 306, the first density modulated bitstream is attenuated by a desired factor in the bitstream domain. At 308, an offset is provided to the first density modulated bitstream in the bitstream domain. At 310, at least one other density modulated bitstream is generated, representing threshold voltages that define a range of permissible values for the voltage. For example, a value representing each threshold voltage can be stored in a register, and an appropriate pulse code to density modulation converter can be used to generate the bit stream. The threshold voltages can include one or more hysteresis references that define a second range of permissible voltages. In one implementation, multiple registers can be used, representing multiple threshold voltages, with appropriate switching means provided to switch between registers. At 312, the first density modulated bitstream is compared to each of the other density modulated bitstreams to determine the value of the voltage relative to the threshold voltages. At 314, an alert can be provided if the measured voltage falls outside a first desired range. The alert can be ended at 316 when the measured voltage returns to a second range defined by the hysteresis voltages to avoid multiple alerts caused by small variations in a voltage near the threshold voltage.

It will be understood that the above description of the present invention is susceptible to various modifications, changes and adaptations, and the same are intended to be comprehended within the meaning and range of equivalents of the appended claims. The presently disclosed embodiments are considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. An apparatus for monitoring a voltage, comprising:
    a level shifter configured to generate a current proportional to the voltage of the battery cell;
    a delta-sigma modulator configured to convert the current into a first density modulated bitstream representing the voltage of the battery cell;
    a first reference source configured to provide a second density modulated bitstream representing a first threshold voltage; and
    a first comparator configured to compare the first density modulated bitstream and the second density modulated bitstream.

2. The apparatus of claim 1, further comprising a scaler configured to attenuate the first density modulated bitstream by a desired factor.

3. The apparatus of claim 1, the scaler comprising a series of full adders, each full adder receiving two associated bitsream inputs, having associated densities, and being configured to provide an output bitstream having a density equal to an average of the respective densities of the bitstream inputs.

4. The apparatus of claim 3, the scaler further comprising a plurality of AND gates, each of the series of full adders having a corresponding AND gate that provides one of the two associated bitstream inputs for its associated full adder.

5. The apparatus of claim 1, further comprising an offset component configured to provide an offset to the first density modulated bitstream in the bitstream domain.

6. The apparatus of claim 1, further comprising:
a second reference source configured to provide a third density modulated bitstream representing a second threshold voltage; and
a second comparator configured to compare the first density modulated bitstream and the third density modulated bitstream.

7. The apparatus of claim 6, the first threshold voltage representing a maximum desired voltage and the second threshold voltage representing a minimum desired voltage, and the first and second comparators being configured to determine if the voltage represented by the first density modulated bitstream is within a range defined by the minimum and maximum voltages.

8. The apparatus of claim 1, the first reference source comprising a first register, configured to store a first value representing the first threshold voltage, a second register, configured to store a second value representing a second threshold voltage, a bit density modulator configured to convert a stored value into a density modulated signal, and a switching element configured to select one of the first register and the second register to provide its associated value to the bit density modulator.

9. The apparatus of claim 1, further comprising generating a third density modulated bitstream, representing a selected hysteresis voltage, and comparing the third density modulated bitstream to the first density modulated bitstream if the first density modulated bitstream exceeds the second density modulated bitstream.

10. A method for monitoring a voltage comprising:
producing a current representing the voltage;
providing the current to a delta-sigma modulator configured to provide a first density modulated bitstream representing the voltage;
generating a second density modulated bitstream representing a first threshold voltage; and
comparing the first density modulated bitstream to the second density modulated bitstream.

11. The method of claim 10, further comprising attenuating the first density modulated bitstream by a desired factor in the bitstream domain.

12. The method of claim 10, further comprising providing an offset to the first density modulated bitstream in the bitstream domain.

13. The method of claim 10, wherein providing the current to the delta-sigma modulator comprises providing the current to a ground referenced capacitor.

14. The method of claim 10, further comprising generating a third density modulated bitstream representing a second threshold voltage and comparing the first density modulated bitstream to the third density modulated bitstream.

15. The method of claim 10, further comprising providing an alert if the voltage represented by the first density modulated bitstream exceeds the first threshold voltage represented by the second density modulated bitstream.

16. The method of claim 10, further comprising generating a third density modulated bitstream, representing a selected hysteresis voltage, and comparing the third density modulated bitstream to the first density modulated bitstream if the first density modulated bitstream exceeds the second density modulated bitstream.

17. A system for monitoring voltage within a battery comprising a stack of battery cells, comprising:
a first reference source configured to provide a first density modulated bitstream representing a first threshold voltage; and
a plurality of cell monitoring assemblies, each cell monitoring assembly configured to monitor a voltage of an associated cell of the stack of battery cells and comprising:
a level shifter configured to generate a current proportional to the voltage of the associated battery cell;
a delta-sigma modulator configured to convert the current into a second density modulated bitstream representing the voltage of the associated battery cell; and
a first comparator configured to compare the first density modulated bitstream and the second density modulated bitstream.

18. The system of claim 17, the system further comprising second reference source configured to provide a third density modulated bitstream representing a second threshold voltage, each of the plurality of cell monitoring assemblies further comprising a second comparator configured to compare the second density modulated bitstream and the third density modulated bitstream.

19. The system of claim 17, the first reference source comprising a first register, configured to store a first value representing the first threshold voltage, a second register, configured to store a second value representing a second threshold voltage, a bit density modulator configured to convert a stored value into a density modulated signal, and a switching element configured to select one of the first register and the second register to provide its associated value to the register to the bit density modulator.

20. The system of claim 19, each of the plurality of cell monitoring assemblies further comprising a delay element that receives an output of the first comparator and is configured to provide a trip signal if the battery cell voltage represented by the second density modulated bitstream exceeds the first threshold voltage represented by the first density modulated bitstream for a predetermined time, the switching element being configured to select the second register in response to the trip signal.

* * * * *